United States Patent [19]

Wrench, Jr. et al.

[11] 4,109,117
[45] Aug. 22, 1978

[54] RANGE DIVISION MULTIPLEXING

[75] Inventors: Edwin H. Wrench, Jr.; Jay C. Hicks, both of San Diego; Joseph F. McCartney, Solana Beach, all of Calif.

[73] Assignee: The United States of America as represented by the Secretary of the Navy, Washington, D.C.

[21] Appl. No.: 831,278

[22] Filed: Sep. 2, 1977

[51] Int. Cl.² .......................... H04B 1/58; H04J 3/08; G01V 1/22; H04Q 9/00
[52] U.S. Cl. .............................. 179/175.3 F; 178/68; 179/15 AL; 324/58.5 B; 343/178
[58] Field of Search ....... 179/15 AL, 15 BL, 175.3 F; 324/58 R, 58 B, 58.5 R, 58.5 B, 52; 178/50, 68; 343/176, 178

[56] References Cited
U.S. PATENT DOCUMENTS

| 3,214,734 | 10/1965 | Whitehead | 179/15 AL |
|---|---|---|---|
| 3,518,628 | 6/1970 | Giel et al. | 179/15 AL |
| 3,609,533 | 9/1971 | Pardis | 179/175.3 F |
| 3,619,504 | 11/1971 | DeVeer et al. | 178/68 |
| 3,909,712 | 9/1975 | Rietz et al. | 179/175.3 F |
| 3,911,226 | 10/1975 | Angelle et al. | 179/15 AL |
| 3,924,077 | 12/1975 | Blakeslee | 343/178 |
| 3,990,036 | 2/1976 | Savit | 179/15 AL |

OTHER PUBLICATIONS

"Pulse Testing of Coaxial Cables," by Lebert, Bell Laboratories Record, Apr. 1951, pp. 153-157.
"Wire Line Fault Finder," by Flanagan, Radio and TV News, Jun. 1949, pp. 9 and 29.

*Primary Examiner*—Thomas A. Robinson
*Attorney, Agent, or Firm*—Richard S. Sciascia; Ervin F. Johnston; John Stan

[57] ABSTRACT

An apparatus is capable of recovering signals from N sites, N≧2, distributed along a single coaxial cable. This multiplexing technique allows the separation of signals from many transducers on one line. Time domain reflectometry (TDR) is used, with variable resistive elements distributed along the cable. TDR is used to detect discontinuities in the impedance of the cable as well as their specific location along the cable. The magnitude of these discontinuities is modulated by an impedance that is proportional to the applied signal. An excellent way of obtaining this kind of variable impendance along the line is to bias a field effect transistor (FET) so that it functions as a variable resistor. For a large number of signals to be multiplexed onto a coaxial cable, an FET is placed at each of the N signal sources. The coaxial cable has a characteristic impedance of $Z_o$ and the FET's are evenly spaced at a distance $l$. Each of the FET's produces a discontinuity on the cable that can be detected by using time domain reflectometry. Microphones may also be used instead of the FET's.

8 Claims, 6 Drawing Figures

APPARATUS FOR INTERROGATING THE CABLE.

TYPICAL FET CONNECTED TO FUNCTION AS A VARIABLE RESISTOR.

APPARATUS PARAMETERS, WITH FETS REPRESENTED AS EQUIVALENT RESISTORS.

APPARATUS FOR INTERROGATING THE CABLE.

APPARATUS FOR DETERMINING THE VALUE OF ANY FET RESISTANCE ALONG THE CABLE.

APPARATUS USING MICROPHONES IN PLACE OF THE FETS.

TYPICAL TDR DISPLAY WITH MICROPHONES AS THE SIGNAL SOURCES.

RANGE DIVISION MULTIPLEXING

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to apparatus which is capable of recovering the signals from N sites, $N \geq 2$, distributed along a single coaxial cable. This multiplexing technique allows the separation of signals from many transducers on one line.

In the prior art, there are three methods of multiplexing signals: time division, frequency division, and spatial division. These techniques all require considerable hardware at each point along the cable where a signal is originated. Time division multiplexing requires that accurate timing be present at each signal source, and necessitates the use of high speed analog switches to gate the signal on the cable at the appropriate times. For frequency division multiplexing, each signal source must have associated hardware for frequency translation. Spatial division multiplexing used in the context of cables corresponds to multiconductor cable. Each signal has a separate path to the receiver. For applications where data originates from many points along the cable, all these techiques require either large multiconductor cables, considerable electronics at each source, or both.

This invention offers the alternative to the techniques discussed hereinabove. It involves the use of time domain reflectometry (TDR) and variable resistive elements distributed along the cable. Each resistive element is variable and each one is distributed somewhere along the cable. Any of the N resistive elements may change its resistance, depending on the instantaneous value of the signal at its input, which generally is a continuous signal. This continuous signal is pulsed at intervals by an interrogation signal generated by the time-domain reflectometer, the pulses being sent down the line, a very small portion of the pulse being reflected back to its source.

SUMMARY OF THE INVENTION

An apparatus for range division multiplexing comprises a coaxial cable having a characteristic impedance of $Z_o$, and defining an input end and an output end. A plurality of N means, disposed along the cable, at distances of $l, 2l, \ldots, Nl$, from the input end of the cable, are able to transduce a voltage into an impedance, generally a resistance. The result is that, upon connection of a time-domain reflectometer at the input of the cable, the values of the input voltages at each location along the cable may be determined.

In the apparatus, the transducing means may comprise a plurality N of transducers, disposed in close proximity to the cable, near various points of the cable. A plurality of N field-effect transistors (FETs) have the input of each connected to an output of a transducer, the FETs being disposed at distances of $l, 2l, \ldots Nl$, from the input end of the cable. The transistors are so biased that, effectively, they function as resistors.

In another embodiment of the invention, in the apparatus the transducing means may comprise N microphones. In this embodiment the FETs would not be required.

Time-domain reflectometry is used to detect discontinuities in the impedance of the cable as well as their specific location along the cable. The magnitude of these discontinuities is modulated by an impedance that is proportional to the applied signal. The impedance is a function of the transducer voltage.

A fixed resistor instead of an FET would not work, because its value as a function of the transducer voltage would stay constant. With TDR techniques, the value of any of the resistors along the cable may be measured, and from these the corresponding transducer voltages may be determined.

OBJECTS OF THE INVENTION

An object of the invention is to provide an apparatus which is capable of recovering a signal at each of a plurality of sites distributed along a single coaxial cable.

Another object of the invention is to provide such apparatus which does not require large multiconductor cables.

Yet another object of the invention is to provide such apparatus which does not require considerable electronics at each source of signals.

These and other objects of the invention will become more readily apparent from the ensuing specification when taken together with the drawings.

DESCRIPTION OF THE PREFERRED EMBODIMENTS

Figure 1:
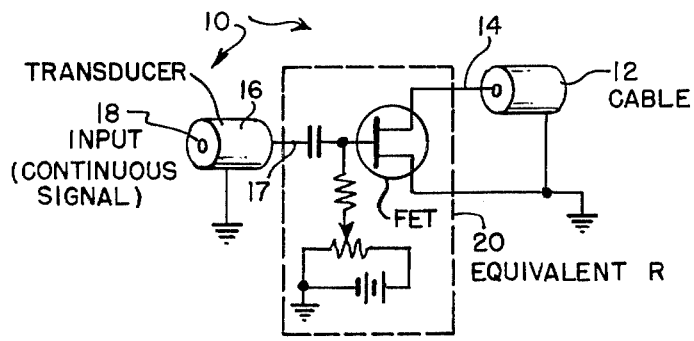
FIG. 1 is a diagram, partially schematic, showing a typical field-effect transistor connected to function as a variable resistor.

Referring now to FIG. 1, therein is shown an apparatus 10 for range division multiplexing, comprising a coaxial cable 12, having a characteristic impedance of $Z_o$, and defining an input end 14 and an output end.

The cable 12 may be disposed along the ground or underwater, in which case the connections to the FETs or microphones would have to be made waterproof.

Figure 2:
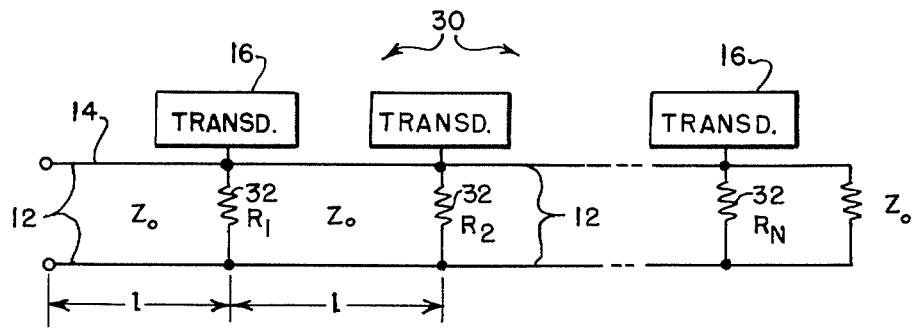
FIG. 2 is a schematic diagram showing the parameters of the apparatus, with FETs represented as resistors.

Referring now to FIG. 2, therein is shown a plurality of N means, 16 and 32, disposed along the cable 10 and at distances of $l, 2l, \ldots, Nl$, from the input end 14 of the cable, the means being able to transduce a voltage into an impedance.

Figure 3:
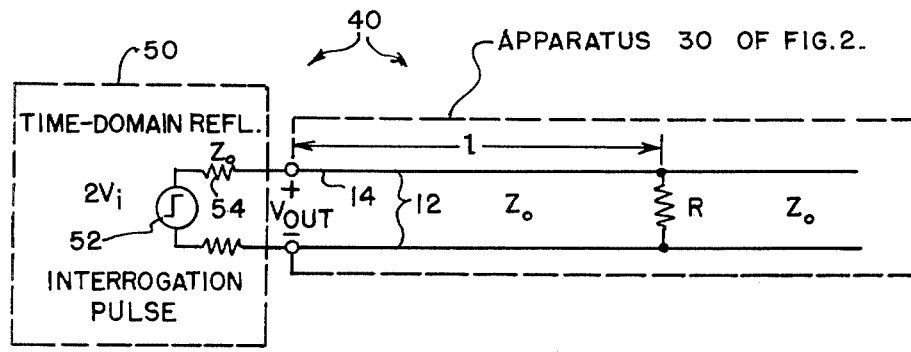
FIG. 3 is a diagram, partially schematic, showing apparatus for interrogating the cable, specifically a time-domain reflectometer.

The result is that, upon connection of a time-domain reflectometer, 50 in FIG. 3, at the input 14 of the cable 10, the values of the input voltages at each location along the cable may be determined.

As is shown in FIG. 2, in the apparatus 30 the transducing means may comprise a plurality N of transducers 16, disposed in close proximity to the cable 12, near various points of the cable.

A plurality of N field-effect transistors (FETs) are designated by the symbol $R_n$, $1 \leq n \leq N$ and the reference numeral 32. The input of each equivalent resistor 32 is connected to an output of a transducer 16. The $R_n$, 32, are disposed at distances of $l$, $2l$, ..., $Nl$, from the input end 14 of the cable 12, the transistors being so biased that they function as resistors.

FIG. 3 shows the connection of the time-domain reflectometer 50 to the apparatus 30 (FIG. 2) of this invention.

In FIGS. 1 and 2, in the apparatus, 10 or 30, the tranducers may be piezoelectric transducers, or may be pyroelectric tranducers.

The theory back of the invention will now be discussed.

An excellent way of obtaining a variable impedance along the line is to bias a field effect transistor (FET) as a variable resistor. The circuit diagram is shown in FIG. 1.

For a large number of signals to be multiplexed onto a coaxial cable, an FET is placed at each signal source. The embodiment 30 is then modeled as shown in FIG. 2.

Referring now to FIG. 3, each of the FET's, represented as R's, 32, in FIG. 2 produce a discontinuity on the cable 12 that can be detected by using a time domain reflectometer 50. The cable 12 is excited with a voltage step 52 from the reflectometer 50, with a source impedance $Z_o$, 54, matched to the characteristic impedance of the cable 12. By measuring the amplitude of the reflected signals as a function of time, the values of each of the resistors, $R_1$-$R_N$, can be determined at discrete times. The rate at which these samples of the resistor values can be obtained is limited by the time required for the voltage step 52 to propagate to the end of the cable 12 and return. For typical cables, the propagation velocity is approximately $\frac{2}{3}$ the speed of light, $2 \times 10^8$ meters/sec. The samples of the FET's resistance must be obtained at a rate of at least twice the highest frequency of interest, that is, at least at the Nyquist rate.

The procedure used to obtain the signal from any one of the N FET's along the cable 12 can be described as follows: From standard time domain reflectometry techniques it is known that any discontinuity along a cable will produce a reflected wave. As an example, the apparatus 30 shown in FIG. 3 has a single discontinuity at distance $l$ from the end 14. When it is excited with a step voltage, $2V_i$, 52, the output voltage, $V_{out}$, will be as follows:

For $0 > t$, $V_{out} = 0$, (1)

for $0 < t < 2l/v_c$ $V_{out} = V_i$, and (2)

$$\frac{2l}{v_c} < t, V_{out} = V_i(1+\rho) \text{ where } \rho = \quad (3)$$

$$\frac{(R//Z_o)-Z_o}{(R//Z_o)+Z_o} = \frac{-Z_o}{Z_o+2R},$$

where $v_c$ is the velocity of the propagating signal. $R//Z_o$ = the parallel impedance of R and $Z_o$. (4)

$$R//Z_o = \frac{1}{\frac{1}{R} + \frac{1}{Z_o}} = \frac{RZ_o}{Z_o + R}. \quad (5)$$

-continued $$\rho = \frac{\frac{RZ_o}{R+Z_o} - Z_o}{\frac{RZ_o}{R+Z_o} + Z_o} = \frac{RZ_o - Z_o(R + Z_o)}{RZ_o + Z_o(R + Z_o)}$$

$$= \frac{-Z_o^2}{RZ_o + Z_o(R + Z_o)} = \frac{-Z_o}{2R + Z_o}, \quad (6)$$

as is shown by Eq. (3).

As the transducer 16 output voltage increases, at point 17, FIG. 1, the value of the equivalent impedance, or resistor R, increases but not necessarily in a linear manner. The time-domain reflectometer, 50, in FIG. 3, detects an impedance discontinuity somewhere along the cable 12, the discontinuity being caused by the transducer voltage across it. Therefore, the transfer characteristics of the input voltage to the FET and the equivalent impedance must be known. When the impedance varies linearly with the voltage, then the transducer voltage can be read off directly. Otherwise a non-linear correction would have to be made, either electronically or by computer.

The analysis is much the same for multiple discontinuities along the cable 12. At each discontinuity, part of the incident wave is reflected and part is transmitted. However, for an arbitrary resistance $R_n$ at the discontinuity, there can be multiple reflection of significant magnitude. However, if one limits the range of the resistor values such that $\rho << 1$, i.e., $R >> Z_o/2$, then the amount of energy reflected at any discontinuity will be small, and the voltage of the incident wave at any point along the cable 12 can be assumed to be constant. This greatly simplifies the analysis and leads to relatively simple expressions relating any of the resistor values $R_1$-$R_N$ to the output voltage.

Referring to FIG. 2, the reflection coefficient $\rho_k$ at any of the FET's is $$\rho_k = \frac{(Z_o//R_k)-Z_o}{(Z_o//R_k)+Z_o} \text{ or } \rho_k = \frac{-1}{\frac{2R_k}{Z_o} + 1}, \quad (7)$$

For $\rho_k << 1$, $2R_k/Z_o >> 1$ or $R_k >> Z_o/2$. (8)

where $R_k$ is the equivalent resistance of the $k$th resistor.

Under these conditions, $\rho_k = -Z_o/2R_k$, (9) and the transmission coefficent, $\tau_k \approx 1$. $\rho_k$ is the percentage of the transmitted wave which is reflected back, and $\rho_k << 1$ means that only a very small proportion of the input signal, $2V_i$, is reflected back to its source, the larger portion of the signal going forward along the cable 12, past the various $R_n$.

Therefore, the output voltage $V_{out}$ can be written as a function of time as follows:

$$\begin{array}{ll}
t \leq 0, & V_{out} = 0 \\
0 \leq t \leq T, & V_{out} = V_i \\
T \leq t \leq 2T, & V_{out} = V_i(1+\rho_1), \\
2T \leq t \leq 3T, & V_{out} = V_i(1+\rho_1+\rho_2), \text{ and} \\
kT \leq t \leq (k+1)T, & V_{out} = V_i(1+\rho_1+\ldots+\rho_k),
\end{array} \quad (10)$$

where $T = \frac{2l}{v_c}$, (11)

= the time to propagate the length $l$ of the cable 12 and back and the source voltage 52 is a step at $t=0$ of amplitude $2V_i$.

Figure 4:
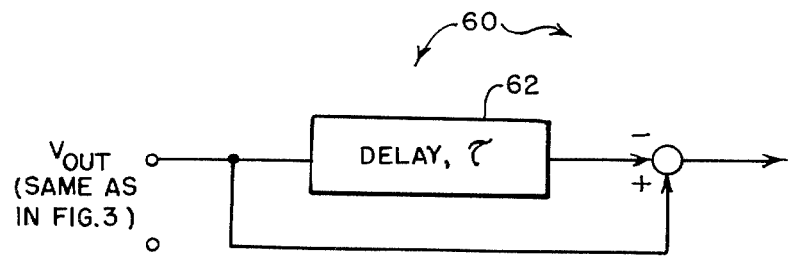
FIG. 4 is a schematic diagram showing apparatus for determining the value of any FET resistance along the cable.

Referring now to FIG. 4, if the output voltage is processed through a delay line 62, the following relationships are obtained:

$$V(t) = V_{out}(\tau) - V_{out}(t-\tau), \quad (12)$$

$$V(k\tau) = V_i(1+\rho_1 + \ldots \rho_k) - V_i(1+\rho_1 + \ldots \rho_{k-1}), \quad (13)$$

$$V(k\tau) = V_i\rho_k, \text{ or} \quad (14)$$

$$R_k = V_iZ_o/2V(k\tau) \quad (15)$$

by use of Eq. (9), disregarding the minus sign.

Therefore, for the case where $\rho_i$'s are much less than 1, the value of any of the FET resistance $R_n$ can be determined by: (1) exciting the line with a step voltage, (2) delaying the output voltage by a time equal to $2l/v_c$, and (3) substracting the delayed output voltage from the current voltage. The desired signal can be obtained directly if a pulse of width $l/v_c$ is used instead of the step.

A reflectometer 50 with a gated output was used, which was controlled by a specific time delay T. A pulse would be sent down the cable 12 and a gate would be enabled at a particular time so that a specific microphone would be picked out which corresponded to a particular distance down the cable. The same method could be used with other transducers used with FET's, instead of microphones.

The only assumption made was that each of the FET resistances $R_n$ must be much larger than $Z_o/2$. How much larger R must be than $Z_o/2$ can be determined by setting limits on the amplitude of the multiply reflected signals.

The problem of multiple reflections has been considered and for the case of $\rho_k << 1$ they can be neglected.

Multiply reflected signals are treated in more detail hereinbelow, in connection with microphones used as variable resistors.

Figure 5:
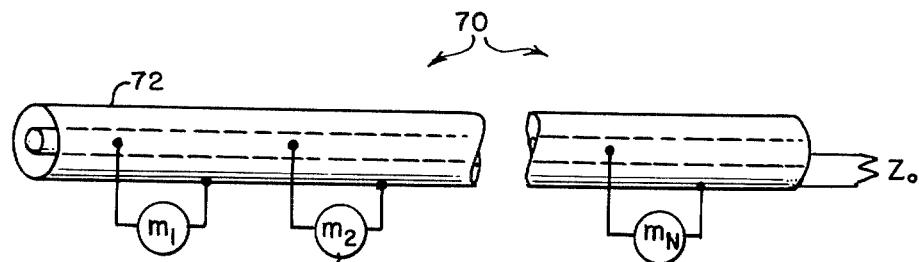
FIG. 5 is a diagram showing the cable, which is part of the apparatus of this invention, using microphones in place of the FETs.

Reference is now directed to the embodiment 70, shown in FIG. 5.

In an early application of the invention, microphones 74 were used, and an attempt was made to detect intelligible speech. In this instance, a certain degree of fidelity was essential. The apparatus was so set up that the signal from a specific microphone 74 was picked up, by monitoring the impedance at that particular point on the cable 72. The signal at any other point on the cable 72 could also be picked up. The cable 72 was connected to the reflectometer, 50 in FIG. 3, whose output was connected to an amplifier and a speaker.

The samples of the microphone resistance must be obtained at a rate of at least twice the highest frequency of interest. For audio signals this rate might be 20,000 samples/sec, or 50 μsec/sample.

Since the time required for one sample is approximately $T = 2L/v_c$ (16) where L is the length of the cable, the following is true:

$$2L/v_c \leq 50 \text{ μs}, \quad (17)$$

$$\text{or } L \leq v_c \cdot 25 \times 10^{-6} \text{ sec} \approx 25 \times 10^{-6} \times 3 \times 10^8 = 7500 \text{ meters}, \quad (18)$$

indicating that cables 72 of lengths of up to 7500 meters can be used to receive frequencies to approximately 10 kHz.

The number of microphones 74 that can be placed along the cable 72 will depend on how accurately the voltage vs. time can be measured on the scale. For example, using fast sample-and-hold circuits, one can obtain samples of voltage approximately every 35 ns. This indicates that reflections from discontinuities at spacings of $l = 35$ ns . $v_c/2 = 5.25$ meters (19) can be discriminated.

The largest multiply reflected waves are ones that are reflected 3 times. Waves that are reflected more than 3 times will be attenuated by a factor of at least $\rho^2$. The number of possible paths with exactly three reflections that will arrive simultaneously at the output is a function of the number of microphones 74 on the cable 72. If one is looking for the direct reflection from the $k^{th}$ microphone, there are $(k-2)(k-1)/2$ other multiply reflected waves with three reflections that arrive simultaneously. This is seen as follows: Considering the $k^{th}$ microphone, the direct path is of length $2kl$.

For the three-reflection wave, it also must have path length $2kl$ to arrive simultaneously. It can reflect from any of the $k-1$ microphones in front of the $k^{th}$ microphone. Say the first reflection occurs at the $j^{th}$ microphone. The second reflection can occur at any of the $j-1$ microphones in front of it. There is not only one unique microphone at which the third reflection can occur to produce the proper total path length. The total number of these three-reflection waves for path length $2kl$ is then $$\sum_{j=1}^{k-1}(j-1) = \sum_{j=0}^{k-2} j = \frac{(k-1)(k-2)}{2}. \quad (20)$$

The output voltage of any one of these waves is $(1+\rho)^{2(k-2)}\rho^3$, where $1+\rho$ is the transmission coefficient, assuming all $\rho$'s equal. The output voltage for all three reflected waves is $$\frac{(k-1)(k-2)}{2}(1+\rho)^{2(k-2)}\rho^3.$$

The output for the direct wave is $(1+\rho)^{2(k-1)}\rho.V_i$. The ratio of these two voltages is to be less than 0.01 for a 1% error, i.e., $$\frac{\frac{(k-1)(k-2)}{2}\rho^2}{(1+\rho)^2} > 0.01 \text{ for all } k<N. \quad (21)$$

For a cable of maximum length 7500 meters and a microphone spacing of 6 meters, the total number of microphones, N = 1250. This implies $$\rho_k = -10^{-4}, \quad (22)$$

or $$R_k = 0.5 \times 10^{+4} Z_o \quad (23)$$

for $$Z_o = 75 \text{ and}$$

$$R = 0.375 \text{ meg}$$

With such a small reflection coefficient, the voltage returned from each microphone will be small, ie.e., $$V(K) \approx V_i\rho_k \approx V_i \times 10^{-4} \quad (24)$$

If one uses a smaller number of microphones, say N = 100, then $$\rho \approx 1.4 \times 10^{-3}, \text{ and} \tag{25}$$

$$V(k\tau) \approx V_i \times 10^{-3}. \tag{26}$$

For large values of N, $\rho$ is inversely proportional to N.

There are other multiply reflected waves with more than three reflections that contribute unwanted signals at the output. However, the signals contributed by these waves are small compared to the directly reflected wave. For example, for the case of waves with five reflections, the number of such waves that will arrive simultaneously with the signal from the $N^{th}$ microphone can be shown to be $$N_5 = \sum_{i=1}^{N-2i-1} \sum_{j=1}^{N-i+j-1} \sum_{k=j+1}^{N-i+j-1} (k-1) \tag{27}$$

The solution for $N_5$ for large N is $$N_5 \approx N^4/2 \tag{28}$$

The amplitude of the five-reflection waves at the output is $(1+\rho)^{2(N-3)}\rho^5$. The rate of the total signal from five-reflection waves to that of the desired signal is $$\frac{(1+\rho)^{2(N-3)}\rho^5 \cdot N^4}{(1+\rho)^{2(N-1)}\rho \cdot 2} = \frac{\rho^4 \cdot N^4}{2(1+\rho)^4} \tag{29}$$

For $N \approx 10^3$ it was shown previously that $\rho < 10^{-4}$ reduced the error from three-reflection waves to 1%. The error from the five-reflection waves under these conditions is $$\frac{\rho^4 N^4}{2(1+\rho)^4} = \frac{10^{-16} \cdot 10^{12}}{2(1-10^{-4})^2} .5 \times 10^{-4} = .005\% \tag{30}$$

The error is the same for the case where N = 100.

Therefore it can be concluded that if $\rho$ is made proportional to 1/N, the errors caused by multiply reflected waves can be limited to 1% or less.

Figure 6:
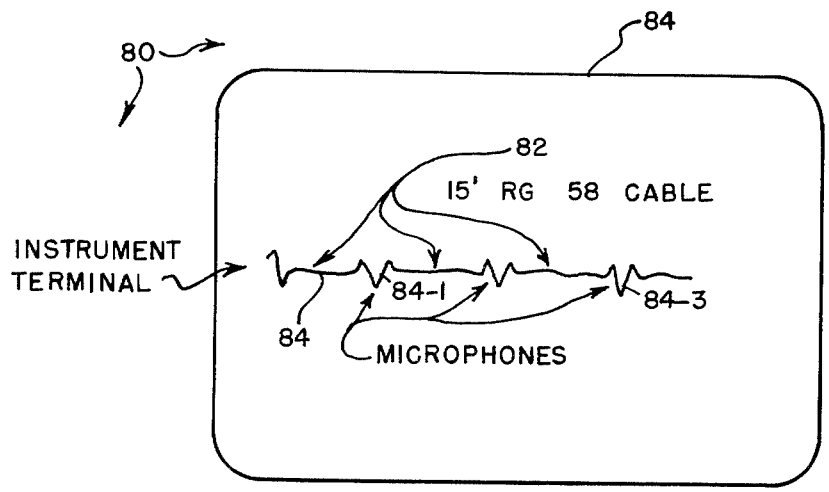
FIG. 6 is a diagrammatic view showing a typical time-domain reflectometry display with microphones as the signal sources.

Reference is now directed to FIG. 6.

To demonstrate this theory, experiments were conducted using a Hewlett-Packard Model 1415A Time Domain Reflectometer. Three carbon granule microphones, as commonly used in a telephone, were connected in parallel, but spaced at 15-foot intervals along an RG-58 coaxial cable, represented by reference numeral 82. The network was trimmed by inserting 390 Ω resistors in series with each microphone connection. An audio power amplifier was connected to the vertical output and the TDR was set for manual scan. Using this equipment it was possible to detect a portable radio played into each of the microphones. The TDR scope had a display 84 as shown in FIG. 6.

Obviously, many modifications and variations of the present invention are possible in the light of the above teachings, and, it is therefore understood that within the scope of the disclosed inventive concept, the invention may be practiced otherwise than specifically described.

What is claimed is:

1. Apparatus for range division multiplexing, comprising:

a coaxial cable having a characteristic impedance of $Z_o$, and defining an input end and an output end;

a first plurality of N transducing means, disposed along and connected to the cable at distances of $l$, $2l, \ldots, Nl$, from the input end of the cable, the means being able to transduce a voltage into an impedance which is substantially a resistance R, R $\gg Z_o/2$; and a second plurality of N transducing means, for transducing a physical parameter into a voltage, the output of each means being connected to an input of one of the first transducing means;

with the result that, upon connection of a time-domain reflectometer at the input of the cable, impedance discontinuities at each location along the cable of the N first transducing means may be detected.

2. The apparatus according to claim 1, wherein the first transducing means comprises:

a plurality of N field-effect transistors (FETs), so biased that they function as resistors.

3. The apparatus according to claim 2 further comprising:

the time-domain reflectometer.

4. The apparatus according to claim 1, wherein the first and second transducing means comprises:

N microphones.

5. The apparatus according to claim 4, further comprising:

the time-domain reflectometer.

6. The apparatus according to claim 2, wherein:

the second plurality of transducing means comprises piezoelectric transducers.

7. The apparatus according to claim 2, wherein:

the second plurality of transducing means comprises pyroelectric transducers.

8. The apparatus according to claim 3, further comprising:

means, whose input is connected to the output of the reflectometer, for delaying the received signal by a delay $\tau$ and inverting the delayed signal at its output, where $\tau = 2l/v_c$, and $v_c =$ the velocity of the propagating signal;

a signal summer, having two inputs, one connected to the input of the delaying means and the other connected to the output of the delaying means;

with the result that, upon energization of the time-domain reflectometer, the values of the input voltages at each location along the cable of the N first transducing means may be determined.

* * * * *